(12) United States Patent
Tang et al.

(10) Patent No.: US 11,018,170 B2
(45) Date of Patent: May 25, 2021

(54) IMAGE SENSOR AND CONTROL METHOD FOR THE SAME

(71) Applicant: PIXART IMAGING INC., Hsin-Chu (TW)

(72) Inventors: Kuan Tang, Hsin-Chu (TW); Jui-Te Chiu, Hsin-Chu (TW); Yi-Cheng Chiu, Hsin-Chu (TW); Chia-Chi Kuo, Hsin-Chu (TW); Kai-Chieh Chuang, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 160 days.

(21) Appl. No.: 16/455,964

(22) Filed: Jun. 28, 2019

(65) Prior Publication Data

US 2020/0411571 A1   Dec. 31, 2020

(51) Int. Cl.
*H01L 27/146* (2006.01)

(52) U.S. Cl.
CPC .. *H01L 27/14612* (2013.01); *H01L 27/14603* (2013.01); *H01L 27/14643* (2013.01)

(58) Field of Classification Search
CPC ......... H01L 27/14612; H01L 27/14643; H01L 27/14603
See application file for complete search history.

(56) References Cited

U.S. PATENT DOCUMENTS

2020/0057149 A1*  2/2020  Kugimiya ............... G01S 7/499
2020/0106971 A1*  4/2020  Winzenread ........... H04N 5/347

\* cited by examiner

*Primary Examiner* — Thanh Luu
*Assistant Examiner* — Monica T Taba
(74) *Attorney, Agent, or Firm* — Li & Cai Intellectual Property (USA) Office (57) ABSTRACT

An image sensor includes a pair of pixel sharing circuits, a second reset transistor, an amplifier transistor, a readout transistor and a control circuit. The pair of pixel sharing circuits connected to a floating diffusion node, each including a photon device, a first reset transistor, a capture transistor, a holding transistor, a capacitor and a sharing transistor. The control circuit is configured to control the first reset transistor, the first capture transistor, the first holding transistor and the sharing transistor of each of the pair of sharing pixel circuits to be turned on or off.

13 Claims, 9 Drawing Sheets

IMAGE SENSOR AND CONTROL METHOD FOR THE SAME

FIELD OF THE DISCLOSURE

The present disclosure relates to an image sensor and control method for the same, and more particularly to an image sensor and a control method for the same capable of operating in a normal mode and a sharing pixel mode for different light intensities and applications.

BACKGROUND OF THE DISCLOSURE

The performance of an image sensor at low brightness is often improved by providing on-chip lenses, each in correspondence to one of the photoelectric conversion elements, and illuminating each photoelectric conversion element with condensed light. The backside illumination image sensor captures an image as signals generated with light illuminating the back side of a semiconductor substrate. The signals are received at photoelectric conversion elements disposed on the semiconductor substrate, and are output through a read circuit formed on the front side of the semiconductor substrate. In order to receive red-color light with a significant wavelength at high efficiency, photoelectric conversion elements (photodiodes) arranged to assure a thickness of approximately 10 μm are disposed at the backside illumination image sensor. The surface of each photoelectric conversion element and the corresponding on-chip lens are set over a short distance from each other and the light passed through the on-chip lens is concentrated in the photoelectric conversion element.

In the BSI (Backside-Illumination Sensor) process, the quantum efficiency (QE) of the image sensor can be significantly improved. However, due to lack of metal on the back of the wafer that can be used to block light, signal temporary storage points are easily affected by ambient light, and shutter efficiency is lowered. Therefore, it is not applicable to applications such as global shutters that require temporary storage of signals.

The existing image sensor uses signal subtraction to obtain correct values. In addition, in applications where the light source is turned on and off for pre-testing, subtraction is proposed to be used to improve frame rate and accuracy. However, this method requires each picture to be taken when the light source is turned on and off, so that time cost is increased.

Moreover, in the subtraction method, the ambient light generated by other pixels or the light source received by other pixels is subtracted, and therefore, the optical environment and angle are not completely identical to the original pixel.

In response to the above drawbacks, the existing image sensor also utilizes single photo diode for multiple pixels. However, although the optical angle is unified for the subtraction method, the reduced number of photodiodes increases the redundant area and efficiency of space utilization decreases.

SUMMARY OF THE DISCLOSURE

In response to the above-referenced technical inadequacies, the present disclosure provides an image sensor and control method for the same.

In one aspect, the present disclosure provides an image sensor including a pair of pixel sharing circuits, a second reset transistor, an amplifier transistor, a readout transistor and a control circuit. The pair of pixel sharing circuits are connected to a floating diffusion node, each including a photon device, a first reset transistor, a capture transistor, a holding transistor, a capacitor and a sharing transistor. The photon device is configured to receive optical energy and generate corresponding charge. The first reset transistor is coupled between a common voltage source and the photon device. The capture transistor has one end connected to a first node between the photon diode and the first reset transistor. The holding transistor has one end connected to another end of the capture transistor and another end connected to the floating diffusion node. The capacitor has one end connected to a second node between the capture transistor and the holding transistor. The sharing transistor is connected between the first node and the second node of another pixel sharing circuit of the pair of pixel sharing circuits. The second reset transistor is connected between a reference voltage source and the floating diffusion node. The amplifier transistor has a control end connected to the floating diffusion node and a first end connected to the common voltage source. The readout transistor is connected between a readout bus and the amplifier transistor and has a control end for receiving a selecting signal. The control circuit is configured to control the first reset transistor, the first capture transistor, the first holding transistor and the sharing transistor of each of the pair of sharing pixel circuits to be turned on or off.

In certain embodiments, the control circuit is configured to be operated in a first mode, and in the first mode, the control circuit is configured to turn on the first reset transistor, the capture transistor, the holding transistor, and the sharing transistor of one of the pixel sharing circuits, and turn off the first reset transistor, the capture transistor and the sharing transistor of the another pixel sharing circuit of the pair of the pixel sharing circuits.

In certain embodiments, the control circuit is configured to be operated in a second mode, and in the second mode, the control circuit is configured to turn on the first reset transistors, the capture transistors and the holding transistors of the pair of the pixel sharing circuits, and turn off the sharing transistors of the pair of the pixel sharing circuits.

In certain embodiments, the image sensor further includes a processor, which is configured to control the control circuit to be operated in the second mode, and the pair of pixel sharing circuits is controlled by the control circuit to obtain a first image. The processor is further configured to obtain an overall light intensity from the first image, and determine whether the overall light intensity exceeds an intensity threshold, if the light intensity exceeds the overall intensity threshold, the processor is configured to control the control circuit to perform the first mode, and wherein if the overall light intensity does not exceed the intensity threshold, the processor is configured to control the control circuit to perform the second mode.

In certain embodiments, the image sensor further includes a light sensor circuit and a processor. The light sensor circuit is configured to measure a light intensity from an external environment outside of the image sensor, and the processor is configured to determine whether the light intensity exceeds an intensity threshold. If the light intensity exceeds the intensity threshold, the processor is configured to control the control circuit to perform the first mode, and if the light intensity does not exceed the intensity threshold, the processor is configured to control the control circuit to perform the second mode.

In certain embodiments, the image sensor further includes a light source connected to the processor. When the control circuit is configured to perform the first mode, the processor is further configured to perform a third mode and a fourth mode. In the third mode, the processor is configured to turn on the light source, control the control circuit to turn on the capture transistor and the holding transistor of the one of the pixel sharing circuits, turn off the sharing transistor of the one of the pixel sharing circuits, and control the pair of pixel sharing circuits to obtain a second image. In the fourth mode, the processor is configured to turn off the light source, control the control circuit to turn off the capture transistor of the one of the pixel sharing circuits, turn on the sharing transistor of the one of the pixel sharing circuits and the and the holding transistor of the another one of the pixel sharing circuits, and control the pair of pixel sharing circuits to obtain a second image. The processor is configured to perform a subtraction operation between the second image and the third image to obtain distance information and movement information.

In certain embodiments, the transistor, device, or circuit is designed to have common structures in a semiconductor integrated circuit design.

In one aspect, the present disclosure provides a control method for an image sensor, which includes the following steps: providing the image sensor, which includes a pair of pixel sharing circuits, a second reset transistor, an amplifier transistor, a readout transistor and a control circuit. The pair of pixel sharing circuits are connected to a floating diffusion node, each including a photon device, a first reset transistor, a capture transistor, a holding transistor, a capacitor and a sharing transistor. The photon device is configured to receive optical energy and generate corresponding charge. The first reset transistor is coupled between a common voltage source and the photon device. The capture transistor has one end connected to a first node between the photon diode and the first reset transistor. The holding transistor has one end connected to another end of the capture transistor and another end connected to the floating diffusion node. The capacitor has one end connected to a second node between the capture transistor and the holding transistor. The sharing transistor is connected between the first node and the second node of another pixel sharing circuit of the pair of pixel sharing circuits. The second reset transistor is connected between a reference voltage source and the floating diffusion node. The amplifier transistor has a control end connected to the floating diffusion node and a first end connected to the common voltage source. The readout transistor is connected between a readout bus and the amplifier transistor and has a control end for receiving a selecting signal. The control method further includes configuring the control to control the first reset transistor, the first capture transistor, the first holding transistor and the sharing transistor of each of the pair of sharing pixel circuits to be turned on or off.

In certain embodiments, the control method further includes configuring the control circuit to be operated in a first mode; configuring the control circuit to turn on the first reset transistor, the capture transistor, the holding transistor, and the sharing transistor of one of the pixel sharing circuits; and configuring the control circuit to turn off the first reset transistor, the capture transistor and the sharing transistor of the another pixel sharing circuit of the pair of the pixel sharing circuits.

In certain embodiments, the control method further includes configuring the control circuit to be operated in a second mode; configuring the control circuit to turn on the first reset transistors, the capture transistors and the holding transistors of the pair of the pixel sharing circuits; and configuring the control circuit to turn off the sharing transistors of the pair of the pixel sharing circuits.

In certain embodiments, the control method further includes configuring a processor to control the control circuit to perform the second mode; configuring the control circuit to control the pair of pixel sharing circuits to obtain a first image; configuring the processor to obtain an overall light intensity from the first image; configuring the processor to determine whether the overall light intensity exceeds an intensity threshold; configuring the processor to control the control circuit to perform the first mode if the light intensity exceeds the overall intensity threshold; and configuring the processor to control the control circuit to perform the second mode if the overall light intensity does not exceed the intensity threshold.

In certain embodiments, the control method further includes configuring a light sensor circuit to measure a light intensity from an external environment outside of the image sensor; and configuring a processor to determine whether the light intensity exceeds an intensity threshold; configuring the processor to control the control circuit to perform the first mode if the light intensity exceeds the intensity threshold; and configuring the processor to control the control circuit to perform the second mode if the light intensity does not exceed the intensity threshold.

In certain embodiments, the control method further includes providing a light source connected to the processor; configuring the processor to perform a third mode and a fourth mode when the control circuit is configured to perform the first mode; configuring, in the third mode, the processor to turn on the light source, and control the control circuit to turn on the capture transistor and the holding transistor of the one of the pixel sharing circuits, turn off the sharing transistor of the one of the pixel sharing circuits, and control the pair of pixel sharing circuits to obtain a second image; configuring, in the fourth mode, the processor to turn off the light source, control the control circuit to turn off the capture transistor of the one of the pixel sharing circuits, turn on the sharing transistor of the one of the pixel sharing circuits and the and the holding transistor of the another one of the pixel sharing circuits, and control the pair of pixel sharing circuits to obtain a second image; and configuring the processor to perform a subtraction operation between the second image and the third image to obtain distance information and movement information.

Therefore, the present disclosure provides an image sensor and a control method for the same, capable of operating in a normal mode and a sharing pixel mode for different light intensities, respectively.

When the ambient light is strong, or a light source performs detection and switching operation, charges at the first nodes can be prevented from flowing into the second nodes, which are storage points. Therefore, the first mode can be performed in the subtraction operation for two captured images to eliminate noise, and therefore a signal-to-noise ratio can be improved. Furthermore, for BSI application, signal temporary storage points will not be easily affected by the ambient light, and the shutter efficiency can be improved.

When the ambient light is weak, or a light source performs in a normal operation without being switched, photon devices are enabled and the sharing transistors are turned off so as to provide isolation between the second nodes. Therefore, all of the photon devices in the image sensor can be utilized for sensing, and efficiency of space utilization can be increased accordingly.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
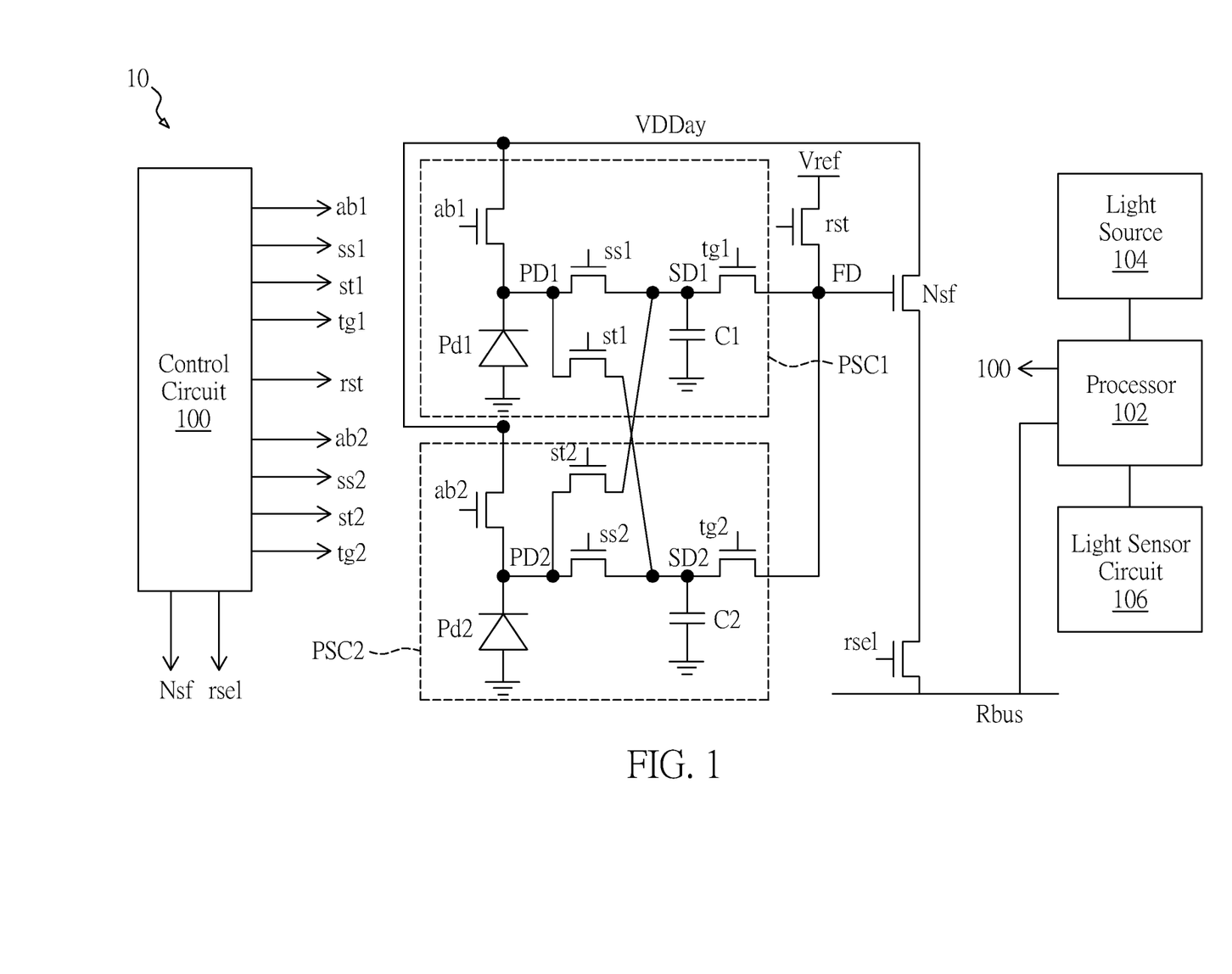
FIG. 1 is a circuit layout of an image sensor according to a first embodiment of the present disclosure.

Referring to FIG. 1, a first embodiment of the present disclosure provides an image sensor 1 including a pair of pixel sharing circuits PSC1 and PSC2, a second reset transistor rst, an amplifier transistor Nsf, a readout transistor rsel and a control circuit 100.

The pair of pixel sharing circuits PSC1 and PSC2 are connected to a floating diffusion node FD. The pixel sharing circuit PSC1 includes a photon device Pd1, a first reset transistor ab1, a capture transistor ss1, a holding transistor tg1, a capacitor C1 and a sharing transistor st1.

The photon device Pd1 is configured to receive optical energy and generate corresponding charge. The photon device Pd1 can be a photodiode, which is a semiconductor device that converts light into an electrical current. The current is generated when photons are absorbed in the photodiode. Photodiodes may contain optical filters and built-in lenses. The first reset transistor ab1 is coupled between a common voltage source VDDay and the photon device Pd1. The capture transistor ss1 has one end connected to a first node PD1 between the photon diode Pd1 and the first reset transistor ab1. The holding transistor tg1 has one end connected to another end of the capture transistor ss1 and another end connected to the floating diffusion node FD.

The capacitor C1 has one end connected to a second node SD1 between the capture transistor ss1 and the holding transistor tg1. The sharing transistor st1 is connected between the first node SD1 and a second node SD2 of another pixel sharing circuit PSC2.

The pixel sharing circuit PSC2 includes a photon device Pd2, a first reset transistor ab2, a capture transistor ss2, a holding transistor tg2, a capacitor C2 and a sharing transistor st2.

The photon device Pd2 is configured to receive optical energy and generate corresponding charge, and can be a photodiode as the photon device Pd1. The first reset transistor ab2 is coupled between a common voltage source VDDay and the photon device Pd2. The capture transistor ss2 has one end connected to a first node PD2 between the photon diode Pd2 and the first reset transistor ab2. The holding transistor tg2 has one end connected to another end of the capture transistor ss2 and another end connected to the floating diffusion node FD.

The capacitor C2 has one end connected to a second node SD2 between the capture transistor ss2 and the holding transistor tg2. The sharing transistor st2 is connected between the first node SD2 and the second node SD1 of another pixel sharing circuit PSC1.

The second reset transistor rst is connected between a reference voltage source Vref and the floating diffusion node FD. The amplifier transistor Nsf has a control end connected to the floating diffusion node FD and a first end connected to the common voltage source VDDay. The readout transistor rsel is connected between a readout bus Rbus and the amplifier transistor Nsf, and has a control end for receiving a selecting signal.

The control circuit 100 is configured to control the first reset transistors ab1 and ab2, the first capture transistors ss1 and ss2, the holding transistors tg1 and tg2, and the sharing transistors st1 and st2 of each of the pair of sharing pixel circuits PSC1 and PSC2 to be turned on or off.

The control circuit 100 can be a microprocessor that incorporates the functions of a central processing unit on a single integrated circuit (IC), or at least a few integrated circuits.

In certain embodiments, the transistor, device, or circuit is designed to have common structures in a semiconductor integrated circuit design.

Figure 2:
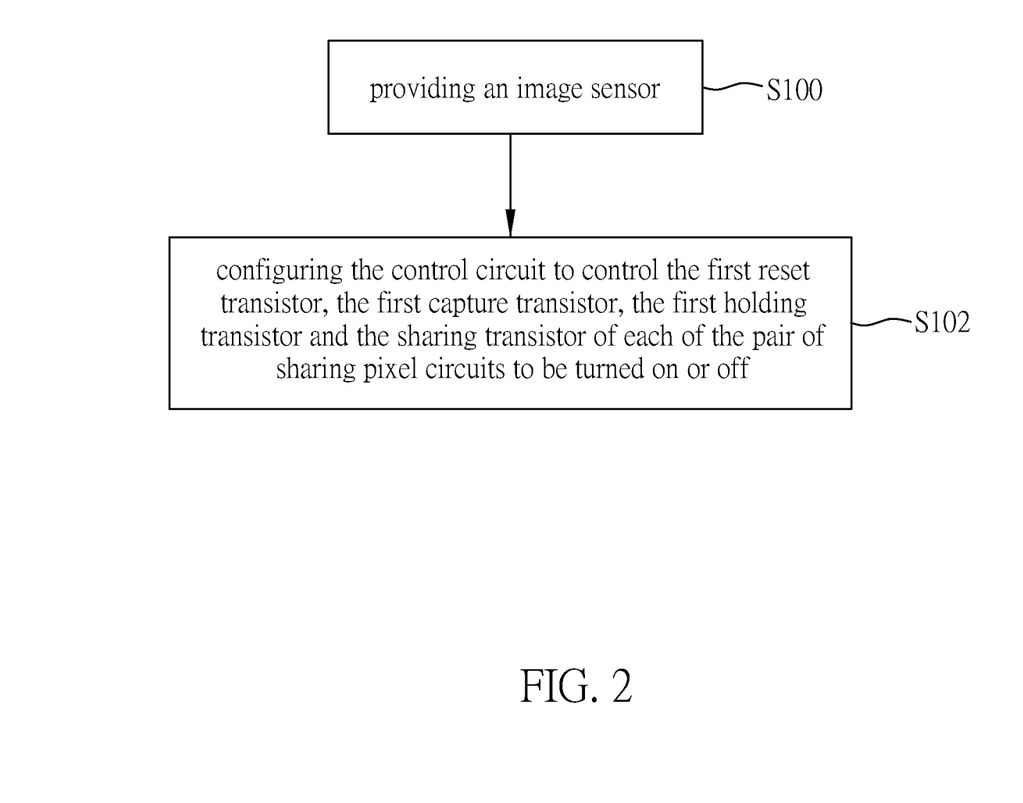
FIG. 2 is a flowchart of the control method according to the first embodiment of the present disclosure.

The present disclosure further provides a control method for an image sensor depicted in FIG. 1. Reference is made to FIG. 2, which is a flowchart of the control method according to the first embodiment of the present disclosure.

The control method according to the above-described embodiments may be implemented by using computer-executed instructions stored or otherwise accessible from a computer-readable medium. Such instructions may include, for example, instructions and data that cause or otherwise configure a general purpose computer, a special purpose computer, or a special purpose processing device to perform a certain function or set of functions. Parts of the computer resources used can be accessed via the Internet. The computer executable instructions may be, for example, binary, intermediate format instructions such as assembly language, firmware, or source code. Examples of computer-readable media that may be used to store instructions, information used, and/or information created during a process in accordance with the described embodiments include a magnetic or optical disk, flash memory, non-volatile memory USB memory devices, networked storage devices, and more.

In addition, devices for implementing the methods provided by the present disclosure may include hardware, firmware, and/or software, and may take any of a variety of configurations. Typical examples of such configurations include laptops, smart phones, small personal computers, personal digital assistants, and the like. The functions described herein may also be implemented in peripheral devices or built-in cards. By way of further example, such functions may also be implemented on circuit boards executing different processes on different chips or on a single device.

As shown in FIG. 2, the control method includes the following steps:

Step S100: providing an image sensor, such as the image sensor 10 depicted in FIG. 1, and repeated descriptions are omitted.

Step S102: configuring the control circuit to control the first reset transistor, the first capture transistor, the first holding transistor and the sharing transistor of each of the pair of sharing pixel circuits to be turned on or off.

Second Embodiment

Figure 3:
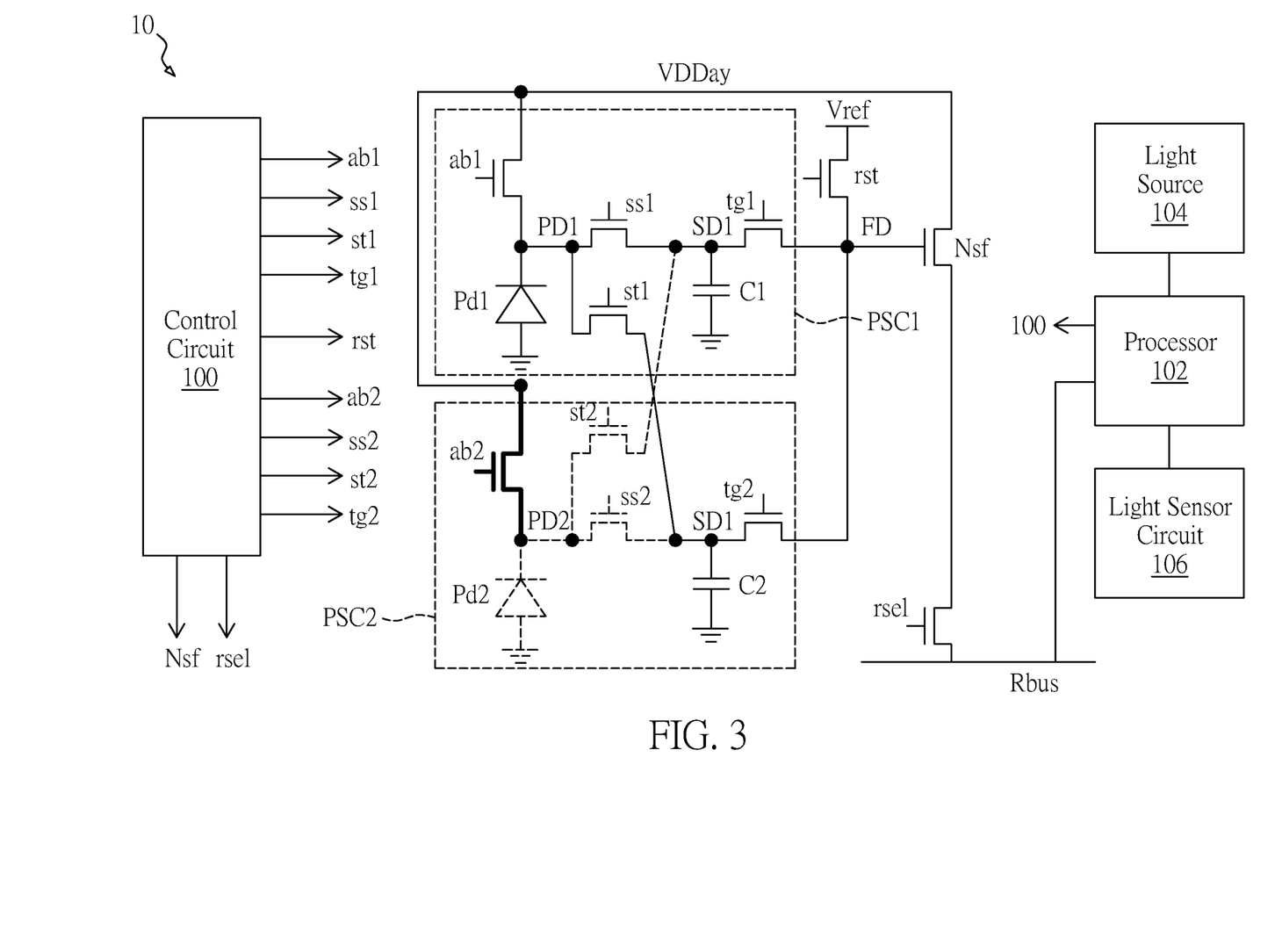
FIG. 3 is a circuit layout of an image sensor according to a second embodiment of the present disclosure.

Reference is made to FIG. 3, which is a circuit layout of an image sensor according to a second embodiment of the present disclosure.

In the second embodiment, the control circuit 100 is configured to be operated in a first mode, and in the first mode, the control circuit 100 is configured to turn on the first reset transistor ab2, the capture transistor ss1, the holding transistor tg1, and the sharing transistor st1 of the pixel sharing circuit PSC1, and turn off the first reset transistor ab1, the capture transistor ss2 and the sharing transistor st2 of the pixel sharing circuit PSC2.

Specifically, when the ambient light is strong, or a light source performs detection and switching operation, the photon device Pd2 is disabled, the first reset transistor ab2 is turned on to reset the first node PD2, and the capture transistor ss2 and the sharing transistor st2 are turned off, so that charges cannot flow into the second nodes SD1 and SD2, which are storage points. Therefore, the first mode can be performed in the subtraction operation for two captured images to eliminate noise, and therefore a signal-to-noise ratio can be improved. Furthermore, for BSI application, signal temporary storage points will not be easily affected by the ambient light, and the shutter efficiency can be improved.

Furthermore, the subtraction operation may include Correlated double sampling (CDS), which is used to reduce the impact of reset sampling noise on dynamic range. CDS includes a technique of taking two samples of a signal out of the pixel and subtracting the first from the second to remove reset sampling noise. Generally, the sampling is performed immediately after reset of the photon device and after the photon device is allowed to accumulate a charge due to change in lighting.

Figure 4:
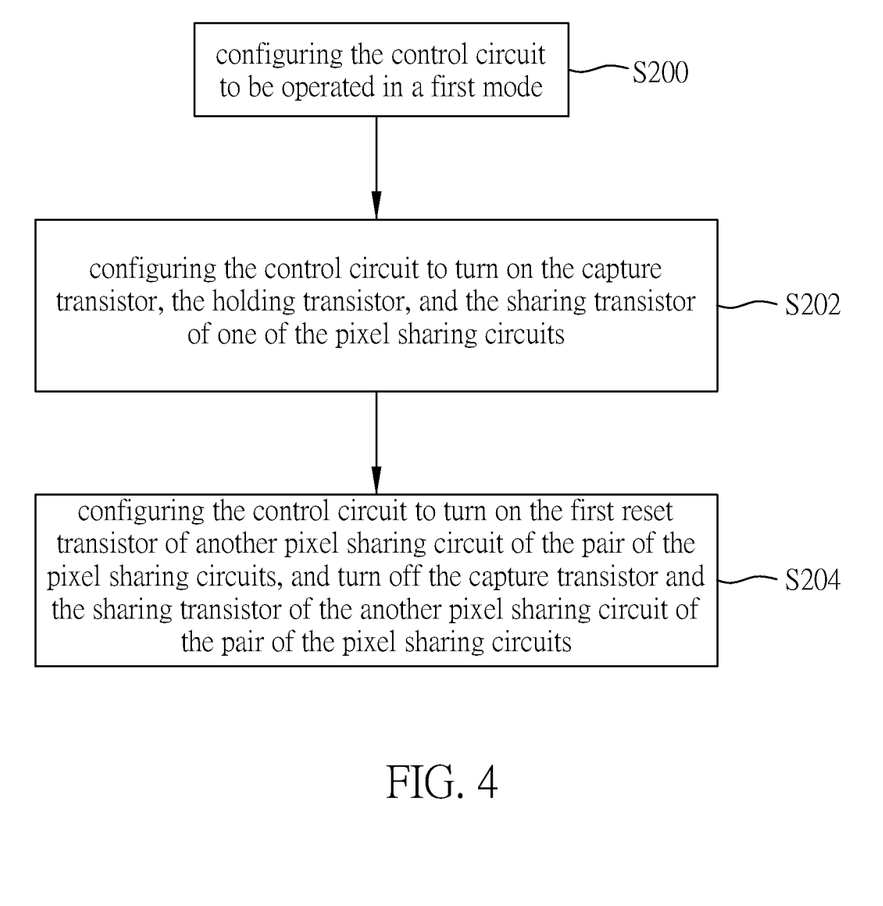
FIG. 4 is a flowchart of the control method according to the second embodiment of the present disclosure.

The second embodiment of the present disclosure provides further steps for the control method. Reference is made to FIG. 4, which is a flowchart of the control method according to the second embodiment of the present disclosure.

As shown in FIG. 4, the control method further includes following steps:

Step S200: configuring the control circuit to be operated in a first mode.

Step S202: configuring the control circuit to turn on the capture transistor, the holding transistor, and the sharing transistor of one of the pixel sharing circuits.

Step S204: configuring the control circuit to turn on the first reset transistor of another pixel sharing circuit of the pair of the pixel sharing circuits, and turn off the capture transistor and the sharing transistor of the another pixel sharing circuit of the pair of the pixel sharing circuits.

Third Embodiment

Figure 5:
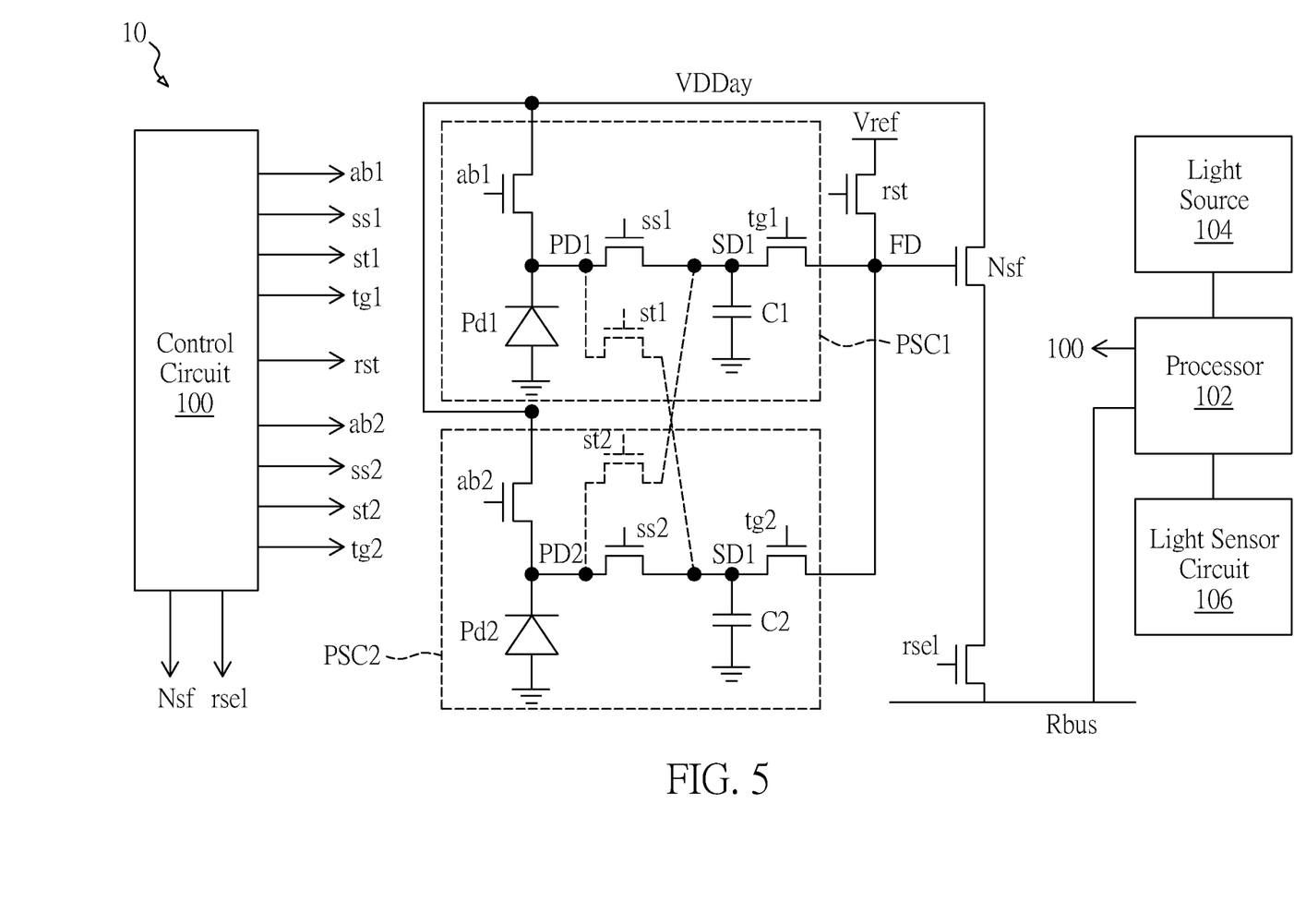
FIG. 5 is a circuit layout of an image sensor according to a third embodiment of the present disclosure.

Reference is made to FIG. 5, which is a circuit layout of an image sensor according to a third embodiment of the present disclosure.

In certain embodiments, the control circuit 100 is operated in a second mode, and in the second mode, the control circuit 100 is configured to turn on the capture transistors ss1 and ss2 and the holding transistors tg1 and tg2 of the pair of the pixel sharing circuits PSC1 and PSC2, and turn off the sharing transistors st1 and st2 of the pair of the pixel sharing circuits PSC1 and PSC2.

Specifically, when the ambient light is weak, or a light source performs in a normal operation without being switched, the photon devices Pd1 and Pd2 are enabled, respectively, and the sharing transistors st1 and st2 are turned off for isolation between the second nodes SD1 and SD2. Therefore, all of the photon devices in the image sensor 10 can be utilized for sensing, and efficiency of space utilization can be increased accordingly.

Figure 6:
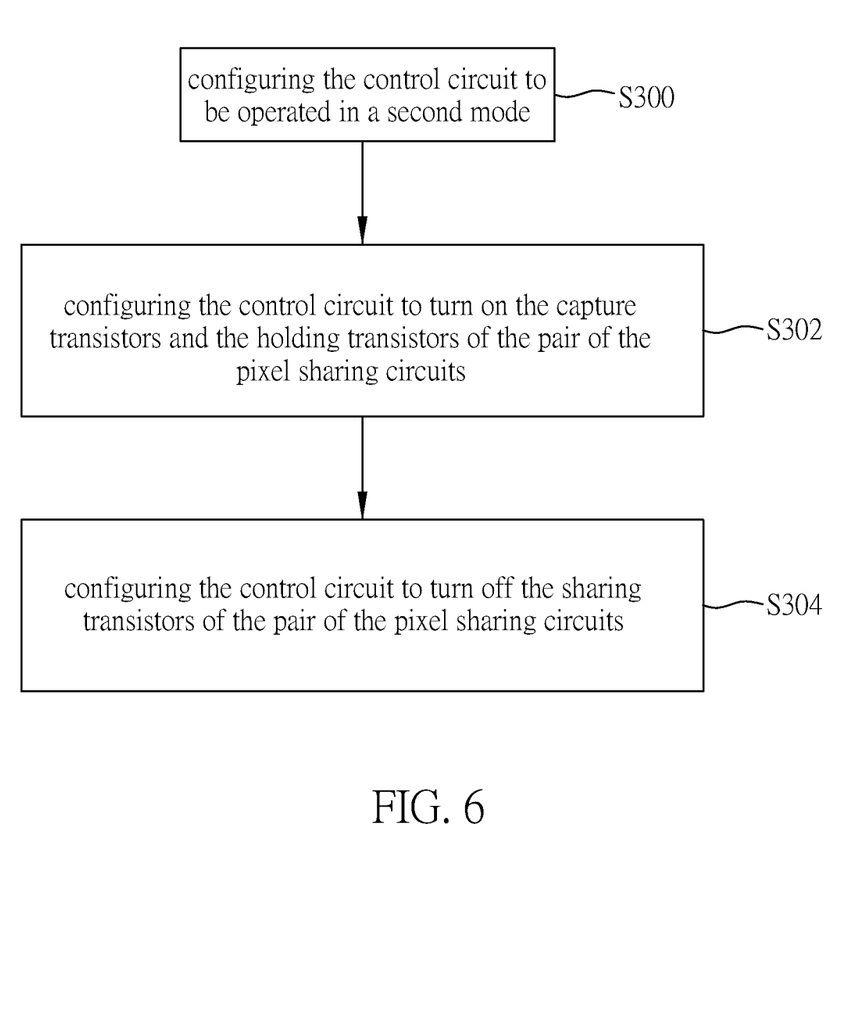
FIG. 6 is a flowchart of the control method according to the third embodiment of the present disclosure.

The third embodiment provides further steps for the control method. Reference is made to FIG. 6, which is a flowchart of the control method according to the third embodiment of the present disclosure.

As shown in FIG. 6, the control method further includes the following steps:

Step S300: configuring the control circuit to be operated in a second mode.

Step S302: configuring the control circuit to turn on the capture transistors and the holding transistors of the pair of the pixel sharing circuits.

Step S304: configuring the control circuit to turn off the sharing transistors of the pair of the pixel sharing circuits.

Fourth Embodiment

Figure 7:
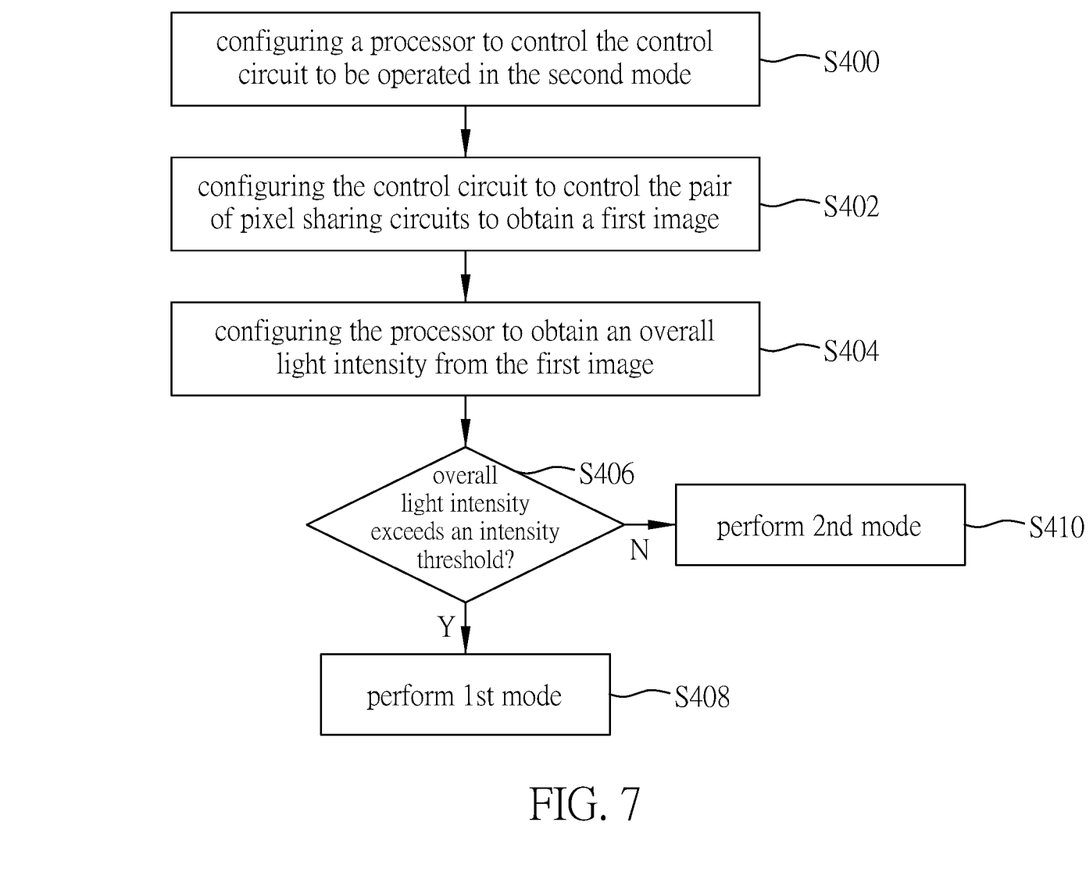
FIG. 7 is a flowchart of the control method according to a fourth embodiment of the present disclosure.

Reference is now made to FIG. 7, which is a flowchart of the control method according to a fourth embodiment of the present disclosure.

The fourth embodiment of the present disclosure provides further steps for the control method. As shown in FIG. 7, the control method further includes the following steps:

Step S400: configuring a processor to control the control circuit to be operated in the second mode. As shown in FIG. 1, the image sensor further includes a processor 102 coupled to the control circuit 100 and the readout bus Rbus. The processor 102 is used to control the control circuit 100 to turn on or off the transistors in the image sensor 10. As mentioned before, in the second mode, the capture transistors ss1 and ss2 and the holding transistors tg1 and tg2 of the pair of the pixel sharing circuits PSC1 and PSC2 are turned on, and the sharing transistors st1 and st2 of the pair of the pixel sharing circuits PSC1 and PSC2 are turned off.

Functions of the processor 102 included in the image sensor 10 may be implemented by using one or more processors. The processor may be a programmable unit, such as a microprocessor, microcontroller, digital signal processor (DSP) chip, a field programmable gate array (field-programmable gate array, FPGA) and the like. Functions of the processor may also be implemented by one or several electronic devices or ICs. In other words, the functions performed by the processor 102 may be implemented in a hardware domain, a software domain or a combination of the hardware domain and the software domain.

Step S402: configuring the control circuit to control the pair of pixel sharing circuits to obtain a first image. The first image can be obtained by, firstly turning off the first reset transistors ab1 and ab2, and the holding transistors tg1 and tg2, and secondly turning off the capture transistors ss1 and ss2 after charges generated by the photon devices Pd1 and Pd2 are stored in the second nodes SD1 and SD2. The stored charges are then readout by the amplifier transistor Nsf, the readout transistor rsel and the readout bus Rbus.

Step S404: configuring the processor to obtain an overall light intensity from the first image. The processor 102 further obtains an overall light intensity from the first image, that is, the intensity of the ambient light can be detected.

Step S406: configuring the processor to determine whether the overall light intensity exceeds an intensity threshold. As mentioned above, the image sensor 10 can operate in the first mode and the second mode according to the light intensity of the ambient light, the first mode works with strong light and the second mode works with weak light.

If the light intensity exceeds the overall intensity threshold, the control method proceeds to step S408, the processor is configured to control the control circuit to perform the first mode.

If the overall light intensity does not exceed the intensity threshold, the processor is configured to control the control circuit to perform the second mode.

Fifth Embodiment

In a fifth embodiment of the present disclosure, the image sensor 10 can further include a light sensor circuit 106 and the processor 102, as shown in FIGS. 1, 3 and 5. The light sensor circuit 106 measures a light intensity from an external environment outside of the image sensor 10, and the processor 102 can determine whether the light intensity exceeds an intensity threshold. The present embodiment provides a different way to obtain the light intensity of the ambient light.

Figure 8:
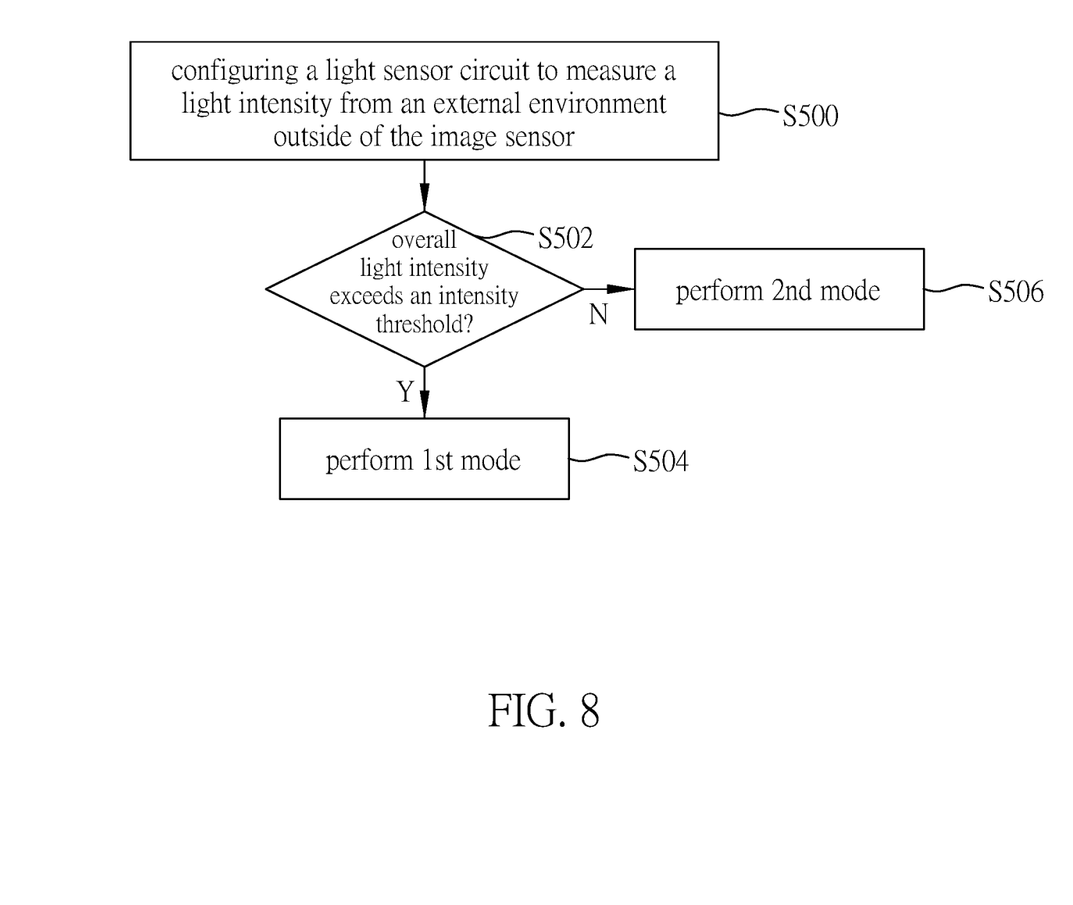
FIG. 8 is a flowchart of the control method according to a fifth embodiment of the present disclosure.

The fifth embodiment of the present disclosure provides further steps for the control method. Reference is made to FIG. 8, which is a flowchart of the control method according to the fifth embodiment of the present disclosure.

As shown in FIG. 8, the control method further includes the following steps:

Step S500: configuring a light sensor circuit to measure a light intensity from an external environment outside of the image sensor.

Step S502: configuring a processor to determine whether the light intensity exceeds an intensity threshold.

If the light intensity exceeds the intensity threshold, the control method proceeds to step S504, the processor 102 is configured to control the control circuit 100 to be operated in the first mode.

If the light intensity does not exceed the intensity threshold, the control method proceeds to step S506, and the processor 102 is configured to control the control circuit 100 to be operated the second mode.

Sixth Embodiment

In a sixth embodiment of the present disclosure, the image sensor further includes a light source 104 connecting to the processor, as shown in FIGS. 1, 3 and 5. The light source 104 can be provided for distance measurement or motion detection.

For example, a motion detection system can be provided with the light source 104 and the photon devices Pd1 and Pd2 configured to receive reflected light from an object when the light source 104 is turned on and off, and output a measured reflectance value corresponding to amplitude of the reflected light. The processor 102 is further configured to receive measured reflectance values and to compare the measured reflectance values at first and second points in time to track motion of the object and identify a gesture of the object corresponding to the tracked motion of the object.

In more detail, when the control circuit 100 is configured to perform the first mode, the processor 102 is further configured to perform a third mode and a fourth mode.

In the third mode, the processor 100 is configured to turn on the light source 104, control the control circuit 100 to turn on the capture transistor ss1 and the holding transistor tg1 of the pixel sharing circuit PSC1, turn off the sharing transistor st1 of the pixel sharing circuit PSC1, and control the pair of pixel sharing circuits PSC1 and PSC2 to obtain a second image.

In the fourth mode, the processor 100 is configured to turn off the light source 104, and control the control circuit 100 to turn off the capture transistor ss1 of the pixel sharing circuit PSC1, and turn on the sharing transistor st1 of the pixel sharing circuit PSC1 and the holding transistor tg2 of the pixel sharing circuit PSC2, and control the pixel sharing circuits PSC1 and PSC2 to obtain a third image.

The processor 102 is then configured to perform a subtraction operation between the second image and the third image to obtain distance information and movement information.

Figure 9:
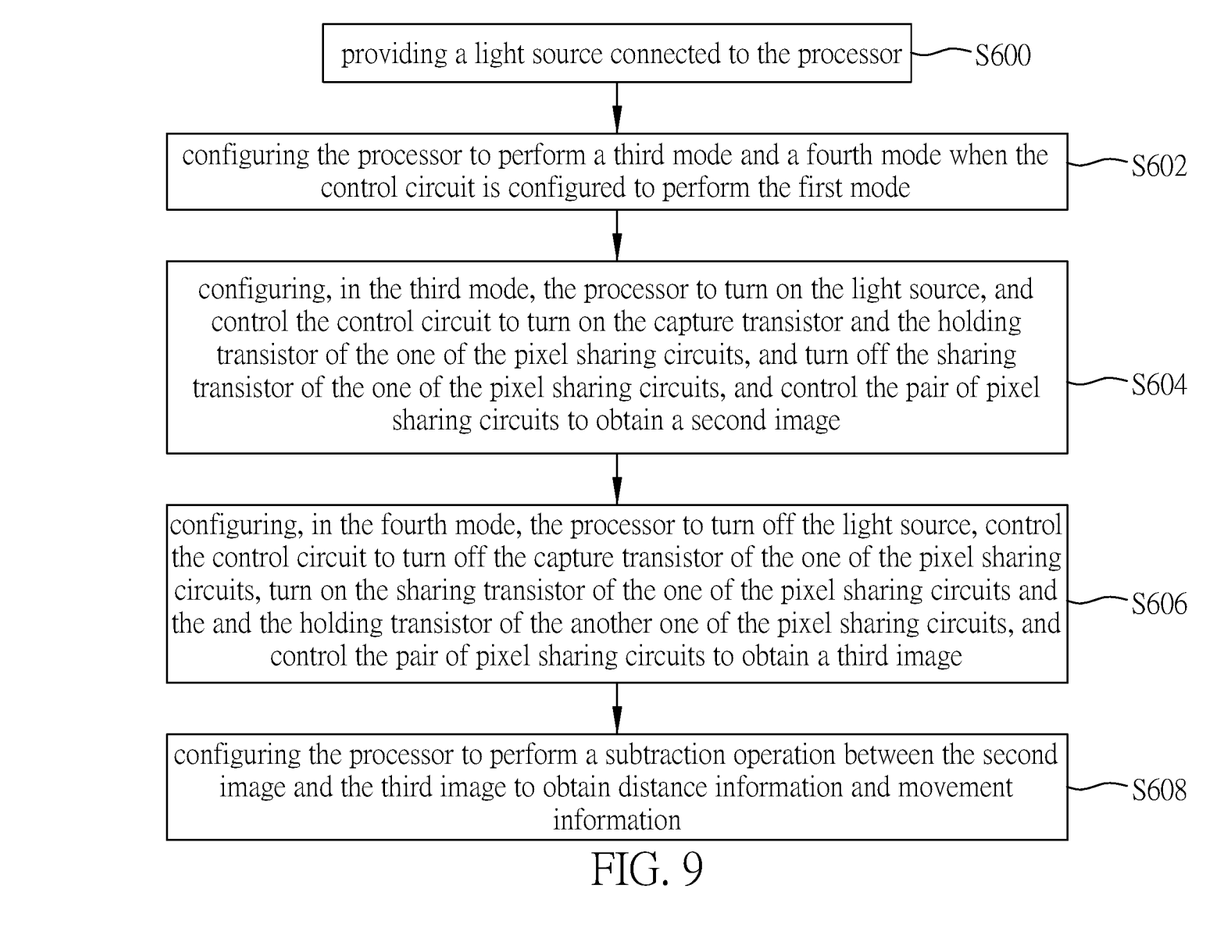
FIG. 9 is a flowchart of the control method according to the sixth embodiment of the present disclosure.

The sixth embodiment of the present disclosure provides further steps for the control method. Reference is made to FIG. 9, which is a flowchart of the control method according to the sixth embodiment of the present disclosure.

As shown in FIG. 9, the control method further includes the following steps:

Step S600: providing a light source connected to the processor.

Step S602: configuring the processor to perform a third mode and a fourth mode when the control circuit is configured to perform the first mode.

Step S604: configuring, in the third mode, the processor to turn on the light source, and control the control circuit to turn on the capture transistor and the holding transistor of the one of the pixel sharing circuits, and turn off the sharing transistor of the one of the pixel sharing circuits, and control the pair of pixel sharing circuits to obtain a second image.

Step S606: configuring, in the fourth mode, the processor to turn off the light source, control the control circuit to turn off the capture transistor of the one of the pixel sharing circuits, turn on the sharing transistor of the one of the pixel sharing circuits and the and the holding transistor of the another one of the pixel sharing circuits, and control the pair of pixel sharing circuits to obtain a third image.

Step S608: configuring the processor to perform a subtraction operation between the second image and the third image to obtain distance information and movement information.

In conclusion, the present disclosure provides an image sensor and a control method for the same, capable of operating in a normal mode and a sharing pixel mode for different light intensities and applications.

When the ambient light is strong, or a light source performs detection and switching operation, the photon device Pd2 is disabled, the first reset transistor ab2 is turned on to reset the first node PD2, and the capture transistor ss2 and the sharing transistor st2 are turned off, so that charges cannot flow into the second nodes SD1 and SD2, which are storage points. Therefore, the first mode can be performed in the subtraction operation for two captured images to eliminate noise, and therefore a signal-to-noise ratio can be improved. Furthermore, for BSI application, signal temporary storage points will not be easily affected by the ambient light, and the shutter efficiency can be improved.

When the ambient light is weak, or a light source performs in a normal operation without being switched, the photon devices Pd1 and Pd2 are enabled, respectively, and the sharing transistors st1 and st2 are turned off so as to provide isolation between the second nodes SD1 and SD2. Therefore, all of the photon devices in the image sensor 10 can be utilized for sensing, efficiency of space utilization can be increased accordingly.

Furthermore, in the first mode, the image sensor can be provided with the light source for distance measurement or motion detection.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image sensor, comprising:
   a pair of pixel sharing circuits, connected to a floating diffusion node, each including:
      a photon device configured to receive optical energy and generate corresponding charge;
      a first reset transistor coupled between a common voltage source and the photon device;
      a capture transistor having one end connected to a first node between the photon diode and the first reset transistor;
      a holding transistor having one end connected to another end of the capture transistor and another end connected to the floating diffusion node;
      a capacitor having one end connected to a second node between the capture transistor and the holding transistor; and
      a sharing transistor connected between the first node and the second node of another pixel sharing circuit of the pair of pixel sharing circuits;
   a second reset transistor connected between a reference voltage source and the floating diffusion node;
   an amplifier transistor having a control end connected to the floating diffusion node and a first end connected to the common voltage source;
   a readout transistor connected between a readout bus and the amplifier transistor and having a control end for receiving a selecting signal; and
   a control circuit configured to control the first reset transistor, the first capture transistor, the first holding transistor and the sharing transistor of each of the pair of sharing pixel circuits to be turned on or off.

2. The image sensor according to claim 1, wherein the control circuit is configured to be operated in a first mode, and
   wherein in the first mode, the control circuit is configured to turn on the first reset transistor, the capture transistor, the holding transistor, and the sharing transistor of one of the pixel sharing circuits, and turn off the first reset transistor, the capture transistor and the sharing transistor of the another pixel sharing circuit of the pair of the pixel sharing circuits.

3. The image sensor according to claim 2, wherein the control circuit is configured to be operated in a second mode, and
   wherein in the second mode, the control circuit is configured to turn on the first reset transistors, the capture transistors and the holding transistors of the pair of the pixel sharing circuits, and turn off the sharing transistors of the pair of the pixel sharing circuits.

4. The image sensor according to claim 3, further comprising:
   a processor configured to control the control circuit to perform the second mode, and the pair of pixel sharing circuits is controlled by the control circuit to obtain a first image,
   wherein the processor is further configured to obtain an overall light intensity from the first image, and determine whether the overall light intensity exceeds an intensity threshold,
   wherein if the light intensity exceeds the overall intensity threshold, the processor is configured to control the control circuit to perform the first mode, and wherein if the overall light intensity does not exceed the intensity threshold, the processor is configured to control the control circuit to perform the second mode.

5. The image sensor according to claim 3, further comprising:
   a light sensor circuit, configured to measure a light intensity from an external environment outside of the image sensor; and
   a processor, configured to determine whether the light intensity exceeds an intensity threshold,
   wherein if the light intensity exceeds the intensity threshold, the processor is configured to control the control circuit to perform the first mode, and wherein if the light intensity does not exceed the intensity threshold, the processor is configured to control the control circuit to perform the second mode.

6. The image sensor according to claim 5, further comprising:
   a light source, connected to the processor,
      wherein when the control circuit is configured to be operated in the first mode, the processor is further configured to perform a third mode and a fourth mode,
      wherein in the third mode, the processor is configured to turn on the light source, control the control circuit to turn on the capture transistor and the holding transistor of the one of the pixel sharing circuits, turn off the sharing transistor of the one of the pixel sharing circuits, and control the pair of pixel sharing circuits to obtain a second image;
      wherein in the fourth mode, the processor is configured to turn off the light source, and control the control circuit to turn off the capture transistor of the one of the pixel sharing circuits, and turn on the sharing transistor of the one of pixel sharing circuits and the and the holding transistor of the another one of the pixel sharing circuits, and control the pair of pixel sharing circuits to obtain a second image,
      wherein the processor is configured to perform a subtraction operation between the second image and the third image to obtain distance information and movement information.

7. The image sensor according to claim 1, wherein the transistor, device, or circuit is designed to have common structures in a semiconductor integrated circuit design.

8. A control method for an image sensor, comprising the following steps:
   providing the image sensor, wherein the image sensor includes:
      a pair of pixel sharing circuits connected to a floating diffusion node and each including:
         a photon device configured to receive optical energy and generate corresponding charge;
         a first reset transistor coupled between a common voltage source and the photon diode;
         a capture transistor having one end connected to a first node between the photon diode and the first reset transistor;
         a holding transistor having one end connected to another end of the capture transistor and another end connected to the floating diffusion node;
         a capacitor having one end connected to a second node between the capture transistor and the holding transistor; and
         a sharing transistor connected between the first node and the second node of another pixel sharing circuit of the pair of pixel sharing circuits;
      a second reset transistor connected between a reference voltage source and the floating diffusion node;
      an amplifier transistor having a control end connected to the floating diffusion node and a first end connected to the common voltage source;
      a readout transistor connected between a readout bus and the amplifier transistor and having a control end for receiving a selecting signal; and
      a control circuit; and
   configuring the control to control the first reset transistor, the first capture transistor, the first holding transistor and the sharing transistor of each of the pair of sharing pixel circuits to be turned on or off.

9. The control method according to claim 8, further comprising:
   configuring the control circuit to be operated in a first mode;
   configuring the control circuit to turn on the first reset transistor, the capture transistor, the holding transistor, and the sharing transistor of one of the pixel sharing circuits; and
   configuring the control circuit to turn off the first reset transistor, the capture transistor and the sharing transistor of the another pixel sharing circuit of the pair of the pixel sharing circuits.

10. The control method according to claim 8, further comprising:
    configuring the control circuit to be operated in a second mode;
    configuring the control circuit to turn on the first reset transistors, the capture transistors and the holding transistors of the pair of the pixel sharing circuits; and
    configuring the control circuit to turn off the sharing transistors of the pair of the pixel sharing circuits.

11. The control method according to claim 9, further comprising:
    configuring a processor to control the control circuit to perform the second mode;
    configuring the control circuit to control the pair of pixel sharing circuits to obtain a first image;
    configuring the processor to obtain an overall light intensity from the first image; and
    configuring the processor to determine whether the overall light intensity exceeds an intensity threshold;
    configuring the processor to control the control circuit to be operated in the first mode if the light intensity exceeds the overall intensity threshold; and
    configuring the processor to control the control circuit to be operated in the second mode if the overall light intensity does not exceed the intensity threshold.

12. The control method according to claim 9, further comprising:
    configuring a light sensor circuit to measure a light intensity from an external environment outside of the image sensor; and
    configuring a processor to determine whether the light intensity exceeds an intensity threshold;
    configuring the processor to control the control circuit to be operated in the first mode if the light intensity exceeds the intensity threshold; and
    configuring the processor to control the control circuit to be operated in the second mode if the light intensity does not exceed the intensity threshold.

13. The control method according to claim 11, further comprising:
    providing a light source connected to the processor;
    configuring the processor to perform a third mode and a fourth mode when the control circuit is configured to be operated in the first mode;
    configuring, in the third mode, the processor to turn on the light source, and control the control circuit to turn on the capture transistor and the holding transistor of the one of the pixel sharing circuits, turn off the sharing transistor of the one of the pixel sharing circuits, and control the pair of pixel sharing circuits to obtain a second image;
    configuring, in the fourth mode, the processor to turn off the light source, control the control circuit to turn off the capture transistor of the one of the pixel sharing circuits, turn on the sharing transistor of the one of the pixel sharing circuits and the holding transistor of the another one of the pixel sharing circuits, and control the pair of pixel sharing circuits to obtain a second image; and configuring the processor to perform a subtraction operation between the second image and the third image to obtain distance information and movement information.

* * * * *